(12) United States Patent
Wicker et al.

(10) Patent No.: US 6,464,843 B1
(45) Date of Patent: Oct. 15, 2002

(54) CONTAMINATION CONTROLLING METHOD AND APPARATUS FOR A PLASMA PROCESSING CHAMBER

(75) Inventors: Thomas E. Wicker, Reno, NV (US); Alan M. Schoepp, Ben Lomond; Robert A. Maraschin, Cupertino, both of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/365,885

(22) Filed: Aug. 3, 1999

Related U.S. Application Data

(63) Continuation-in-part of application No. 09/050,902, filed on Mar. 31, 1998, now abandoned.

(51) Int. Cl.[7] .................. C23C 14/34; C23C 16/00; C23F 1/00
(52) U.S. Cl. ................ 204/192.15; 204/192.35; 204/298.11; 204/298.07; 204/298.15; 204/298.31; 204/298.33; 156/345; 216/67; 118/721; 118/723 I; 427/569; 427/585
(58) Field of Search ............... 156/345; 204/298.07, 204/298.11, 298.15, 192.12, 298.37, 192.35, 298.31, 298.06, 298.02; 118/723 I, 721; 216/67, 68; 427/569, 585, 595; 266/664

(56) References Cited

U.S. PATENT DOCUMENTS

| | | |
|---|---|---|
| 4,340,462 A | 7/1982 | Koch |
| 4,399,546 A | 8/1983 | Phillips |
| 4,579,618 A | 4/1986 | Celestino et al. |
| 4,701,427 A | 10/1987 | Boecker et al. |
| 4,710,428 A | 12/1987 | Tamamizu et al. |
| 4,786,359 A | 11/1988 | Stark et al. |
| 4,863,657 A | 9/1989 | Tanaka et al. |
| 4,948,458 A | 8/1990 | Ogle |
| 4,981,551 A | 1/1991 | Palmour |
| 4,999,228 A * | 3/1991 | Matsumoto et al. .......... 427/589 |
| 5,006,220 A | 4/1991 | Hijikata et al. ......... 204/298.33 |
| 5,085,727 A * | 2/1992 | Steger ........................ 156/345 |
| 5,182,059 A * | 1/1993 | Kawasaki et al. ............ 266/664 |
| 5,198,718 A | 3/1993 | Davis et al. ............. 313/359.1 |
| 5,200,232 A | 4/1993 | Tappan et al. |
| 5,241,245 A | 8/1993 | Barnes et al. |
| 5,262,029 A | 11/1993 | Erskine et al. |
| 5,277,751 A | 1/1994 | Ogle |
| 5,292,399 A | 3/1994 | Lee et al. |
| 5,304,279 A | 4/1994 | Coultas et al. ............... 156/345 |
| 5,324,411 A | 6/1994 | Ichishima et al. |
| 5,367,139 A | 11/1994 | Bennett et al. |
| 5,399,237 A * | 3/1995 | Keswick et al. ................ 216/68 |
| 5,401,350 A | 3/1995 | Patrick et al. |
| 5,409,563 A * | 4/1995 | Cathey ........................ 216/51 |
| 5,441,568 A * | 8/1995 | Cho et al. .............. 204/298.07 |
| 5,444,217 A | 8/1995 | Moore et al. |

(List continued on next page.)

FOREIGN PATENT DOCUMENTS

| | | |
|---|---|---|
| EP | 0063273 A | 10/1982 |
| EP | 0 779 651 | 6/1997 |
| EP | 0 821 397 | 1/1998 |

(List continued on next page.)

*Primary Examiner*—Patrick Ryan
*Assistant Examiner*—Gregg Cantelmo
(74) *Attorney, Agent, or Firm*—Burns, Doane, Swecker & Mathis, LLP

(57) ABSTRACT

A plasma processing chamber includes a substrate holder and a member of silicon carbide such as a liner, focus ring, perforated baffle or a gas distribution plate, the member having an exposed surface adjacent the substrate holder and the exposed surface being effective to minimize contamination during processing of substrates. The chamber can include an antenna which inductively couples RF energy through the gas distribution plate to energize process gas into a plasma state.

28 Claims, 3 Drawing Sheets

U.S. PATENT DOCUMENTS

| | | |
|---|---|---|
| 5,460,684 A | 10/1995 | Saeki et al. |
| 5,463,525 A | 10/1995 | Barnes et al. |
| 5,494,523 A | 2/1996 | Steger et al. |
| 5,538,230 A | 7/1996 | Sibley |
| 5,556,501 A * | 9/1996 | Collins et al. ............... 156/345 |
| 5,569,356 A | 10/1996 | Lenz et al. |
| 5,584,936 A | 12/1996 | Pickering et al. |
| 5,611,955 A | 3/1997 | Barrett et al. |
| 5,725,675 A | 3/1998 | Fong et al. |
| 5,728,253 A * | 3/1998 | Saito et al. ................. 156/345 |
| 5,788,799 A | 8/1998 | Steger et al. ............... 156/345 |
| 5,792,304 A * | 8/1998 | Tamura et al. .............. 156/345 |
| 5,863,376 A * | 1/1999 | Wicker et al. .............. 156/345 |
| 5,891,350 A * | 4/1999 | Shan et al. .................. 216/71 |
| 5,904,778 A * | 5/1999 | Lu et al. ................. 204/298.02 |
| 6,048,798 A | 4/2000 | Gadgil et al. |
| 6,129,808 A | 10/2000 | Wicker et al. |

FOREIGN PATENT DOCUMENTS

| | | |
|---|---|---|
| EP | 0 826 646 | 3/1998 |
| JP | 60-200519 | 10/1985 |
| JP | H3-10592 | 1/1988 |
| JP | 63-138737 | 6/1988 |
| JP | 63-273323 | 11/1988 |
| JP | 2-111663 A | 4/1990 |
| JP | 9-246238 A | 9/1997 |
| WO | WO96/23913 | 8/1996 |

* cited by examiner

CONTAMINATION CONTROLLING METHOD AND APPARATUS FOR A PLASMA PROCESSING CHAMBER

This application is a continuation-in-part of application Ser. No. 09/050,902, filed on Mar. 31, 1998, now abandoned.

FIELD OF THE INVENTION

The invention relates to improvements in a plasma processing chamber and to a method of processing a substrate in the plasma processing chamber such as by plasma etching an oxide layer on a semiconductor wafer.

BACKGROUND OF THE INVENTION

Vacuum processing chambers are generally used for chemical vapor depositing (CVD) and etching of materials on substrates by supplying process gas to the vacuum chamber and application of an RF field to the gas. Examples of parallel plate, transformer coupled plasma (TCP™, also called ICP), and electron-cyclotron resonance (ECR) reactors are disclosed in commonly owned U.S. Pat. Nos. 4,340,462; 4,948,458; and 5,200,232. The substrates are held in place within the vacuum chamber during processing by substrate holders.

Conventional substrate holders include mechanical clamps and electrostatic clamps (ESC). Examples of mechanical clamps and ESC substrate holders are provided in commonly owned U.S. Pat. No. 5,262,029 and commonly owned U.S. Pat. No. 5,671,116. Substrate holders in the form of an electrode can supply radiofrequency (RF) power into the chamber, as disclosed in U.S. Pat. No. 4,579,618. According to U.S. Pat. No. 5,292,399, metal surfaces of wafer support and clamping ring mechanisms can be covered with insulating material to prevent erosion by the plasma and electrically conductive material can be used to reduce arcing due to charge build-up on such insulation surfaces.

Plasma processing systems wherein an antenna coupled to a radiofrequency (RF) source energizes gas into a plasma state within a process chamber are disclosed in U.S. Pat. Nos. 4,948,458; 5,198,718; 5,241,245; 5,304,279; and 5,401,350. In such systems, the antenna is located outside the process chamber and the RF energy is supplied into the chamber through a dielectric window. Such processing systems can be used for a variety of semiconductor processing applications such as etching, deposition, resist stripping, etc.

SUMMARY OF THE INVENTION

An object of the present invention is to reduce metal and/or particle contamination of plasma processed substrates when substrates are processed continuously by using silicon carbide as the material of one or more reactor surfaces such as a chamber liner surrounding the substrate holder, a focus ring surrounding the substrate, a baffle plate between the liner and substrate holder, and/or a gas distribution plate facing the substrate.

According to one aspect of the invention, a method of processing a substrate and reducing contamination thereof comprises placing a substrate on a substrate holder in a processing chamber wherein a member such as a liner, gas distribution plate, baffle plate and/or focus ring forms an exposed surface in the processing chamber in an area adjacent the substrate holder, the member comprising a silicon carbide based material and the member being effective to minimize particle and/or metal contamination of the substrates during the processing step as a result of reduced plasma potential on the silicon carbide member and/or reduced sputtering of non-silicon carbide chamber interior surfaces. The method includes processing the substrate by supplying process gas to the processing chamber and energizing the process gas into a plasma state such as by inductively coupling RF energy through the gas distribution plate into the processing chamber and consecutively processing substrates in the processing chamber by contacting the substrates with the plasma gas. The processing chamber can include a substantially planar antenna and the process gas can be energized into the plasma state by supplying RF power to the antenna. The plasma can comprise a high density plasma and the substrates can be processed by etching an oxide layer on the substrates with the high density plasma while supplying an RF bias to the substrates. The member preferably consists essentially of hot pressed, sintered, CVD or reaction bonded SiC.

According to another aspect of the invention, a plasma processing chamber includes a member comprising a silicon carbide based material, the member comprising a chamber liner, a focus ring, a baffle plate and/or a gas distribution plate. The chamber further includes a substrate holder for supporting a substrate within the processing chamber, a gas supply supplying process gas to an interior of the chamber, and an energy source such as an RF energy source which supplies RF energy into the chamber to energize the process gas into a plasma state. The chamber can further include a dielectric window adjacent the gas distribution plate and the RF energy source can comprise a substantially planar antenna adjacent the window, the antenna supplying RF power through the window to energize process gas in the processing chamber into a plasma state. The antenna can be arranged such that the gas outlets in the gas distribution plate are not directly between the substrate holder and the antenna. The dielectric window can have a substantially uniform thickness and substantially planar configuration and the gas distribution plate can have a substantially uniform thickness and substantially planar configuration.

BRIEF DESCRIPTION OF THE DRAWINGS

The invention will be described in greater detail with reference to the accompanying drawings in which like elements bear like reference numerals, and wherein.

DETAILED DESCRIPTION OF THE PREFERRED EMBODIMENTS

Figure 1:
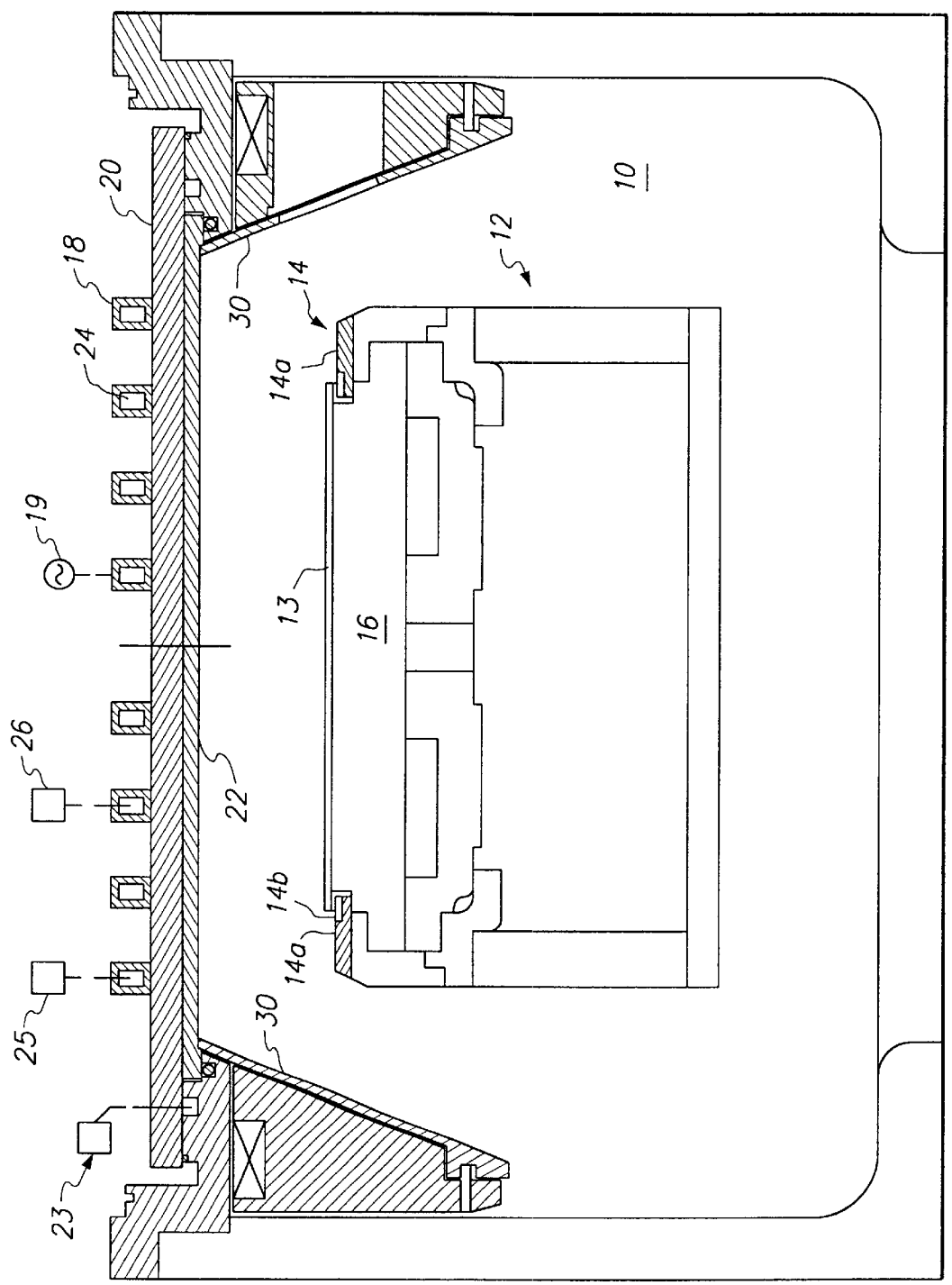
FIG. 1 is a cross sectional view of a vacuum processing chamber having a liner, focus ring, baffle and/or gas distribution plate according to the invention.

In plasma gas processing of semiconductor substrates such as silicon wafers, high density plasmas typically cause a relatively high erosion rate of chamber interior surfaces they contact due to physical and/or chemical sputtering. This is an important issue in applications for wafer processing in the semiconductor industry, due to the sensitivity of devices on the wafer to contamination from metals which are deep impurities in silicon such as nickel and iron, alkali metals such as sodium and potassium that are mobile ions in the gate oxide of devices causing unstable threshold voltage, and metals such as aluminum which cause leakage currents in device junctions resulting, for example, in short refresh times in DRAM memory cells. Because of this, the surfaces of the chamber exposed to the high density plasma in such wafer processing tools are normally covered with a nonmetallic material such as alumina or quartz.

Alumina and quartz are dielectric materials which present a high impedance to the RF current used to sustain the plasma, and the RF current used to induce a bias voltage on the wafer. As a result, the RF current through the plasma does not have a good ground path and can become unstable, resulting in non-repeatable etch results. Moreover, charge build-up on the dielectric materials can cause arcing and thus localized sputtering of the dielectric materials.

The present invention uses silicon carbide (SiC) as a consumable chamber surface material which reduces metal and/or particle contamination of the processed substrates. The SiC is preferably electrically conductive so that when it is in contact with the plasma it presents a good ground path for the RF current. The SiC also etches at a slow rate by the plasma making it a cost effective consumable part. Moreover, because the SiC is of high purity, wafer contamination resulting from chemical sputtering of the SiC by the plasma can be minimized. That is, the silicon carbide member can minimize particle generation by formation of gaseous $SiC_4$. Further, the grounded SiC can reduce sputtering of other surfaces in the chamber by causing a reduction in the plasma potential and hence ion bombardment energy to these non-silicon carbide surfaces. To the extent the SiC component replaces alumina as a chamber surface, aluminum contamination of wafers can be reduced. Finally, the SiC component provides a very stable plasma potential so that etch results are more repeatable within an individual chamber and from chamber to chamber.

The invention provides improvements in reducing contamination of substrates such as semiconductor wafers, flat panel display substrates, and the like. The reduced contamination can be achieved by utilizing silicon carbide as the material for members adjacent the substrate being processed in the chamber. Such members include non-electrically driven chamber parts such as liners, focus rings, gas distribution plates, baffle plates and the like. As an example, an SiC liner can be used to provide a better RF return path for the powered electrode (bottom electrode) in the wafer support. The SiC liner provides a grounded surface which is resistant to erosion from ion bombardment. The silicon carbide member can consist entirely of SiC, comprise a SiC coated material such as SiC coated graphite, or principally SiC with 10 to 20% Si added to fill porosity in reaction bonded SiC.

In plasma etching, features can be etched into layers of various materials on substrates such as silicon wafers. In such etching processes, a gas distribution plate can be used to control the spatial distribution of gas flow in the volume of the reactor above the plane of the wafer. In the TCP 9100™ plasma etching reactor available from LAM Research Corporation, the gas distribution plate is a circular plate situated directly below the TCP™ window which is also the vacuum sealing surface at the top of the reactor in a plane above and parallel to the wafer. The gas distribution plate is sealed using an O-ring to a gas distribution ring located at the periphery of the gas distribution plate. The gas distribution ring feeds gas from a source into the volume defined by the gas distribution plate, an inside surface of a window underlying a coil supplying RF energy into the reactor, and the gas distribution ring. The gas distribution plate contains an array of holes of a specified diameter which extend through the plate. The spatial distribution of the holes through the gas distribution plate can be varied to optimize etch uniformity of the layers to be etched, e.g., a photoresist layer, a silicon dioxide layer and an underlayer material on the wafer. The cross-sectional shape of the gas distribution plate can be varied to manipulate the distribution of RF power into the plasma in the reactor. The gas distribution plate material must be a dielectric to enable coupling of this RF power through the gas distribution plate into the reactor. Further, the material of the gas distribution plate must be highly resistant to chemical sputter-etching in environments such as oxygen or a hydrofluorocarbon gas plasma in order to avoid breakdown and the resultant particle generation associated therewith. Moreover, the material of the gas distribution plate should have low levels of contaminants that might otherwise affect performance of devices on the wafer. According to the invention, the gas distribution plate can be of specially prepared silicon carbide having high resistivity.

According to another aspect of the invention, it has surprisingly and unexpectedly been found that use of silicon carbide for interior chamber surfaces provides performance results which far exceed other materials such as aluminum nitride and alumina. Preferably, the silicon carbide material is electrically grounded thereby reducing plasma potential on surfaces within the chamber.

A vacuum processing chamber according to one embodiment of the present invention is illustrated in FIG. 1. The vacuum processing chamber 10 includes a substrate holder 12 providing an electrostatic clamping force to a substrate 13 as well as an RF bias to a substrate while it is He backcooled. A focus ring 14 comprising a dielectric outer ring 14a and a SiC inner ring 14b confines plasma in an area above the substrate. A source of energy for maintaining a high density (e.g., $10^{11}$–$10^{12}$ ions/cm$^3$) plasma in the chamber such as an antenna 18 powered by a suitable RF source and suitable RF impedance matching circuitry inductively coupled RF energy into the chamber 10 so as to provide a high density plasma. The chamber includes suitable vacuum pumping apparatus for maintaining the interior of the chamber at a desired pressure (e.g., below 50 mTorr, typically 1–20 mTorr). A substantially planar dielectric window 20 of uniform thickness provided between the antenna 18 and the interior of the processing chamber 10 forms the vacuum wall at the top of the processing chamber 10. A gas distribution plate 22 is provided beneath window 20 and includes openings such as circular holes for delivering process gas from the gas supply 23 to the chamber 10. A conical liner 30 extends from the gas distribution plate and surrounds the substrate holder 12. The antenna 18 can be provided with a channel 24 through which a temperature control fluid is passed via inlet and outlet conduit 25,26. However, the antenna 18 and/or window 20 could be cooled by other techniques such as by blowing air over the antenna and window, passing a cooling medium through or in heat transfer contact with the window and/or gas distribution plate, etc.

In operation, a wafer is positioned on the substrate holder 12 and is typically held in place by an electrostatic clamp, a mechanical clamp, or other clamping mechanism when He backcooling is employed. Process gas is then supplied to the vacuum processing chamber 10 by passing the process gas through a gap between the window 20 and the gas distribution plate 22. Suitable gas distribution plate arrangements (i.e., showerhead) arrangements are disclosed in commonly owned U.S. Pat. Nos. 5,824,605, 5,863,376 and 6,048,798, the disclosures of which are hereby incorporated by reference. For instance, while the window and gas distribution plate arrangement in FIG. 1 are planar and of uniform thickness, non-planar and/or non-uniform thickness geometries can be used for the window and/or gas distribution plate. A high density plasma is ignited in the space between the substrate and the window by supplying suitable RF power to the antenna 18. A temperature control fluid can also be passed through the channel 24 in the antenna 18 to maintain the antenna 18, window 20 and gas distribution plate 22 at a temperature below a threshold temperature such as less than 120° C., preferably below 90° C. and more preferably below 80° C.

Figure 2:
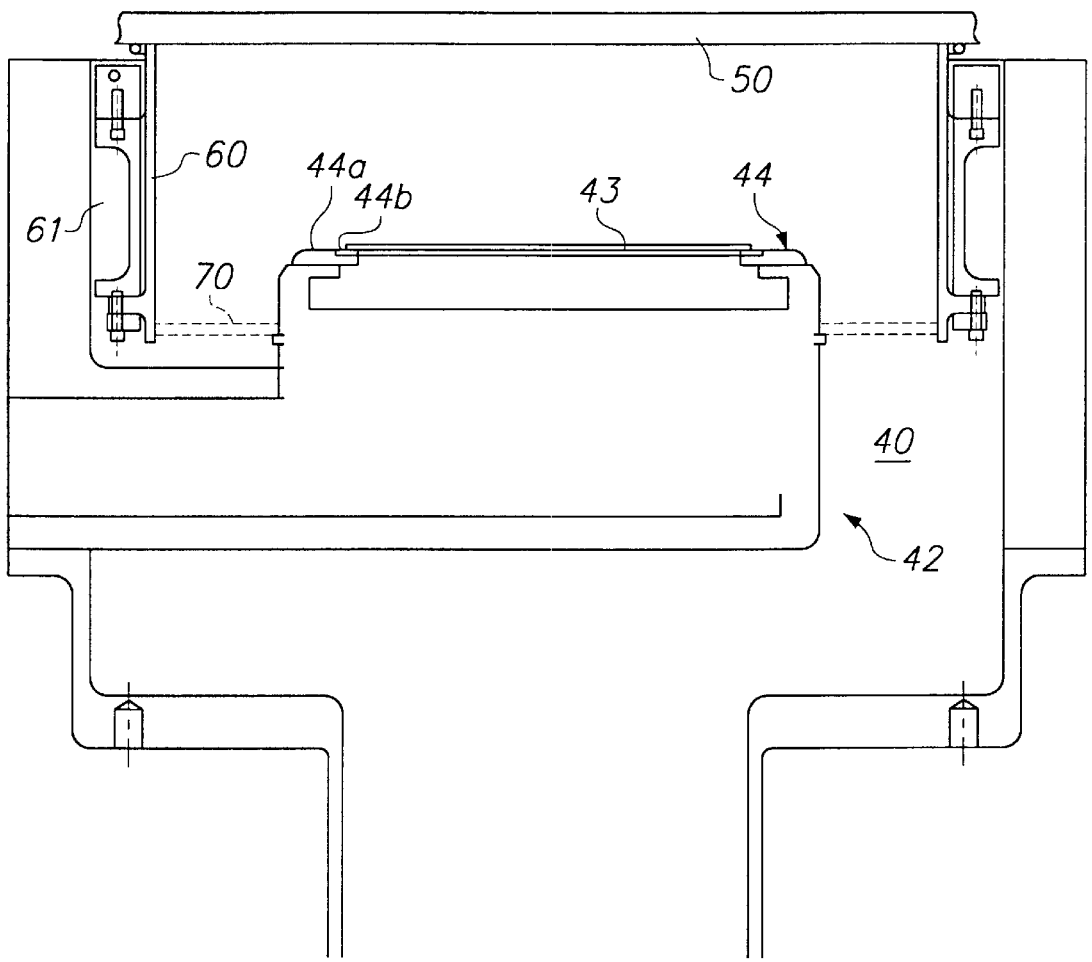
FIG. 2 is a cross sectional view of a modified vacuum processing chamber according to the invention wherein the liner is cylindrical in shape.
Figure 4:
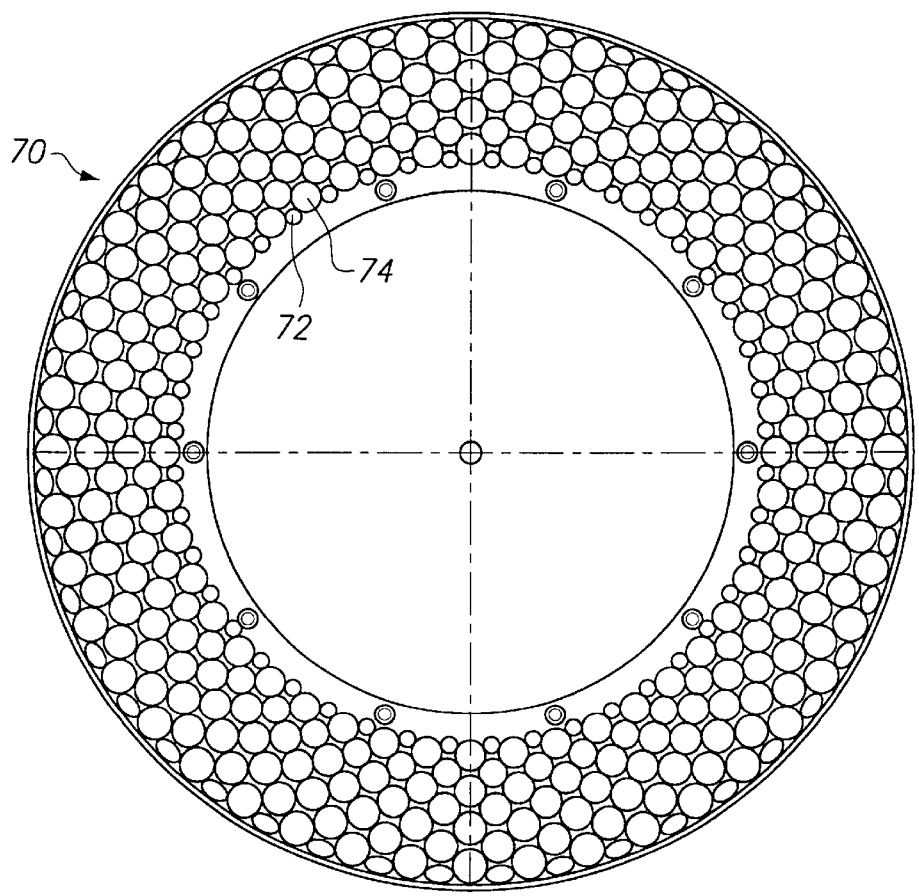
FIG. 4 is a top view of a baffle ring according to the invention.

A vacuum processing chamber according to another embodiment of the present invention is illustrated in FIG. 2. The vacuum processing chamber 40 includes a substrate holder 42 providing an electrostatic clamping force to a substrate 43 as well as an RF bias to a substrate supported thereon. A focus ring 44 having outer dielectric portion 44a and inner SiC portion 44b confines plasma in an area above the substrate while it is He backcooled. A source of energy for maintaining a high density (e.g. $10^{11}$–$10^{12}$ ions/cm$^3$) plasma in the chamber such as an antenna (not shown) powered by a suitable RF source and suitable RF impedance matching circuitry inductively couples RF energy into the chamber 40 so as to provide a high density plasma. The chamber includes suitable vacuum pumping apparatus for maintaining the interior of the chamber at a desired pressure (e.g. below 50 mTorr, typically 1–20 mTorr). A substantially planar dielectric window of uniform thickness can be provided between the antenna and the interior of the processing chamber 40 and to form the vacuum wall at the top of the processing chamber 40. A gas distribution plate, commonly called a showerhead 50, is provided beneath the window and includes a plurality of openings such as circular holes (not shown) for delivering process gas supplied by a suitable gas supply to the processing chamber 40. A cylindrical liner 60 extends from the gas distribution plate and surrounds the substrate holder 42. A baffle ring 70 extends between the substrate holder 42 and the liner 60. The liner 60 and/or the baffle ring 70 can be heated by a heating member 61 which can be heated by any suitable technique such as resistance heating, a heated fluid, etc. Details of the baffle ring 70 are shown in FIG. 4 wherein it can be seen that the baffle ring 70 includes small holes 72 and large holes 74 for passage of gases and by-products to a vacuum pump connected to the bottom of the chamber.

Figure 3:
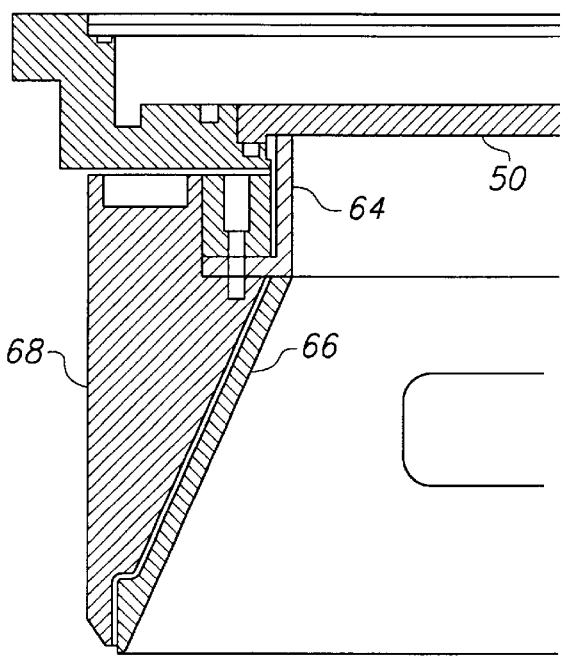
FIG. 3 is a cross sectional view of a portion of a modified vacuum processing chamber in accordance with the invention wherein the liner includes a cylindrical portion and a conical portion.

In another embodiment, as shown in FIG. 3, a modified liner 62 can include a cylindrical portion 64 and a conical portion 66. In this embodiment, a heater 68 includes resistive elements (not shown) which are used to maintain the portion 64 and/or portion 66 at a desired temperature.

Substrates which are etched in an oxide etching process generally include an underlayer, an oxide layer which is to be etched, and a photoresist layer formed on top of the oxide layer. The oxide layer may be one of SiO$_2$, BPSG, PSG, or other oxide material. The underlayer may be Si, TiN, silicide, or other underlying layer or substrate material. The etch selectivity, which is the etch rate of the layer to be etched compared to the photoresist etch rate is preferably around 4:1 or higher. The etch selectivity of the oxide layer compared to the underlayer is preferably greater than the oxide:photoresist etch selectively, e.g., 40:1.

According to the invention, a silicon carbide chamber liner, focus ring, baffle ring and/or gas distribution plate reduces metal and/or particle contamination of substrates during processing such as etching of dielectric materials such as silicon dioxide (e.g., doped or undoped TEOS, BPSG, USG (undoped spin-on-glass), thermal oxide, plasma oxide, etc.) typically overlying a conductive layer such as silicon, polysilicon, silicide, titanium nitride, aluminum or a non-conductive material such as silicon nitride. According to the invention, features (such as contact holes, vias, trenches, etc.) can be provided having dimensions of 0.5 $\mu$m and below and aspect ratios ranging from 2:1 to 7:1 can be etched from substrate to substrate during sequential batch processing of substrates such as semiconductor wafers (e.g., 25 or more consecutive wafers) while maintaining particle contamination of the wafers below acceptable levels.

During oxide etching, the chamber pressure is typically below 300 mTorr, preferably 1–40 mtorr, the antenna is powered at 200–5000 watts, preferably 300–2500 watts, the RF bias is $\leq$6000 watts, preferably 1000–2500 watts, and the He backpressure is 5–40 Torr, preferably 7–20 Torr. The process gas can include 10–200 sccm CHF$_3$, 10–100 sccm C$_2$HF$_5$ and/or 10–100 sccm C$_2$F$_6$.

The silicon carbide member is preferably formed as a separate piece attachable to the reaction chamber by any suitable technique. For instance, a silicon carbide liner can be bolted to an electrically grounded part of the chamber thereby providing grounding of the liner. Alternatively, the silicon carbide can be a coating on metal and/or ceramic parts of the chamber. In the case where the silicon carbide member is a gas distribution plate, the silicon carbide preferably has a resistivity high enough to allow an RF antenna to couple RF energy into the chamber. For instance, the silicon carbide can be hot pressed to obtain resistivity values on the order of about 5×10$^4$Ω·cm. For even higher resistivities, SiC powder can be doped with a suitable additive or sintered in a nitrogen atmosphere to form Si$_3$N$_4$ in grain boundaries of the silicon carbide and thus raise the resistivity to values such as 1×10$^8$Ω·cm. In making a gas distribution plate, suitable gas passages and outlet holes can be provided in a green ceramic material which is later sintered to form a unitary plate. In order to prevent plasma from striking in the passages and/or holes, the dimensions of the passages and holes are preferably small enough to avoid conditions under which plasma would form during flow of process gas and powering of the antenna.

The liner, focus ring, baffle plate and/or gas distribution plate can be made of various blends of silicon carbide based powder material having a predominant amount of silicon carbide. For instance, the total amount of silicon and carbon is typically at least 90 wt %, preferably $\geq$95 wt %, and more preferably $\geq$99 wt %. For example, the SiC member may include up to about 0.5% B to aid sintering of the SiC powder. The SiC member may include an excess of Si such as up to about 35 wt % free Si and/or Si$_3$N$_4$. The silicon carbide material can be made by any suitable process such as hot pressing, sintering, reaction bonding (e.g., wherein SiC is infiltrated with molten Si), etc. For uses such as the liner, focus ring and/or baffle, the silicon carbide preferably has a low resistivity such as below 200Ω·cm. The resistivity is much higher, however, when the SiC member is used for a window and/or gas distribution plate used in conjunction with an RF antenna. If a different RF source is used, the window/gas distribution plate can be replaced with a low resistivity SiC member. In order to avoid metal contamination during processing of semiconductor substrates, the SiC member is preferably made by a process which avoids the presence of such metals in the SiC member. The silicon and carbon are preferably present in amounts sufficient achieve a nominal SiC stoichiometry. Such mixtures can be formed into a desired shape, sintered and machined to desired tolerances and/or surface finishes on surfaces such as vacuum sealing surfaces. The SiC member preferably is highly dense, e.g., having a density over 3.1 g/cm$^3$.

In the case where the SiC member is formed by CVD, it is preferable to deposit enough SiC to form a bulk member. For instance, SiC can be deposited on a graphite mandrel and when a desired thickness of SiC is achieved, the graphite mandrel can be etched away leaving a highly pure and highly dense SiC member.

The silicon carbide member according to the invention provides dramatic reduction in particle count on wafers processed during oxide etching and oxygen cleaning steps. The silicon carbide member also reduces particle contamination during an ashing process wherein 750 sccm oxygen gas can be run for 10 seconds with the TCP™ power at 650 W, the bottom electrode at 750 W and the pressure at 10 mTorr. Compared to an alumina liner which is attacked during the etching and oxygen cleaning steps and can liberate aluminum which could contaminate wafers, a silicon carbide liner provides better contamination performance since there is preferably less than 200 ppm Al in the silicon carbide material. Moreover, during processing such as plasma etching, by-products produced as a result of erosion of the SiC are volatile and thus do not contribute to adding particles on the wafers and the liberated elements Si and C are not detrimental to wafer processing.

In order to provide highly pure and/or highly thermally conductive SiC components, such components can be made of CVD SiC. The CVD SiC can be deposited on a substrate such as graphite and grown to a desired thickness after which the substrate is removed such as by machining. For example, in the case of a cylindrical liner, CVD SiC can be deposited to a desired thickness on a graphite cylinder and the graphite cylinder is later machined away leaving the CVD SiC cylinder liner. Advantages of the CVD SiC include high thermal conductivity (e.g., CVD SiC has about twice as much thermal conductivity as sintered SiC) and tailored electrical resistivity (e.g., resistivity of SiC can be varied from electrically conducting to semiconducting). An advantage of using CVD SiC for the reactor components is that it is possible to obtain a highly uniform temperature distribution across the surface of the component inside the reactor. In the case of processing wherein the component is maintained at a high enough temperature to minimize polymer buildup on the exposed surfaces of the component, the use of CVD SiC is highly advantageous from the standpoint of temperature control and minimizing particle generation.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A method of processing a substrate and reducing metal and/or particle contamination thereof comprising steps of:
   (a) placing a substrate on a substrate holder in a processing chamber, the processing chamber including at least one member having an exposed surface adjacent the substrate, the member comprising a silicon carbide based material;
   (b) processing the substrate by supplying process gas to the processing chamber and energizing the process gas into a plasma state in the processing chamber, the silicon carbide member being exposed to the plasma and providing a ground path for RF current sustaining the plasma;
   (c) removing the substrate from the processing chamber; and
   (d) consecutively processing additional substrates in the processing chamber by repeating steps (a–c) while minimizing particle contamination of the substrates during the processing step as a result of reduction of plasma potential on the silicon carbide member and/or reduced sputtering of non-silicon carbide chamber interior surfaces, the silicon carbide member comprising a liner inside the processing chamber and forming a sidewall of the processing chamber, and the liner being a separate piece attached to an electrically grounded part of the chamber providing electrical grounding of the liner.

2. The method according to claim 1, wherein the process gas comprises one or more hydrofluorocarbon gases.

3. The method according to claim 1, wherein the plasma comprises a high density plasma and each of the substrates are processed by etching an oxide layer on the substrates with the high density plasma while supplying an RF bias to the substrates.

4. The method according to claim 1, wherein the silicon carbide member further comprises a gas distribution plate supplying the process gas to the processing chamber, a perforated baffle extending between the substrate holder and the liner, a focus ring surrounding the substrate or combination thereof, the exposed surface of the silicon carbide member minimizing particle generation by formation of gaseous SiC$_4$.

5. The method according to claim 3, wherein the processing chamber includes a planar antenna powered at 200 to 5000 watts and the RF bias is 1000 to 2500 watts.

6. The method according to claim 1, wherein the silicon carbide member consists essentially of a composite wherein a coating of SiC forms the exposed surface of the silicon carbide member, the exposed surface of the silicon carbide member minimizing particle generation by formation of gaseous SiC$_4$.

7. The method according to claim 1, wherein the silicon carbide member further comprises a baffle, the liner surrounding the substrate holder and the baffle comprising a ring extending between the liner and the substrate holder, the liner being heated to a temperature above room temperature during the processing step.

8. The method according to claim 1, wherein the chamber includes a substantially planar dielectric window and a silicon carbide gas distribution plate having sufficient electrical resistivity to make the silicon carbide gas distribution plate an insulating material, the processing chamber including an antenna adjacent the window coupling RF energy into the chamber through the window and the gas distribution plate.

9. The method according to claim 8, wherein the liner has a resistivity below 200 Ω·cm, the exposed surface of the silicon carbide member minimizing particle generation by formation of gaseous SiC$_4$.

10. The method according to claim 1, wherein the silicon carbide member comprises CVD SiC which erodes as a gas due to contact with the plasma.

11. The method according to claim 1, wherein during step (b) contact holes or vias are etched into a dielectric layer on the substrate, the contacts or vias having aspect ratios ranging from 2:1 to 7:1.

12. The method according to claim 1, wherein the process gas comprises 10 to 200 sccm $CHF_3$, 10 to 100 sccm $C_2H_5$, and/or 10 to 100 sccm $C_2F_6$.

13. The method according to claim 1, wherein the liner comprises reaction bonded silicon carbide infiltrated with molten Si.

14. The method according to claim 1, wherein the liner comprises a bulk member formed by CVD.

15. The method according to claim 1, wherein the liner is surrounded by a heated member, the method further comprising heating the liner to a desired temperature with heat generated by the heated member.

16. A plasma processing chamber comprising:
- a substrate holder for supporting a substrate within an interior of the processing chamber;
- at least one member having an exposed surface adjacent the substrate, the member comprising a silicon carbide based material having a density of at least 3.1 g/cm$^3$ and including at least 99 wt % carbon and silicon, the member comprising a liner inside the processing chamber and forming a sidewall of the processing chamber wherein the liner is a separate piece attached to an electrically grounded part of the chamber providing electrical grounding of the liner;
- a gas supply supplying process gas to the interior of the processing chamber; and
- an energy source supplying energy into the interior of the processing chamber and energizing the process gas into a plasma state for processing a substrate, the silicon carbide member minimizing particle contamination of substrates during plasma processing thereof as a result of reduction of plasma potential on the silicon carbide member and/or reduced sputtering of non-silicon carbide chamber interior surfaces.

17. The plasma processing chamber according to claim 16, wherein the liner is surrounded by a heated member which maintains the liner at a desired temperature.

18. The plasma processing chamber according to claim 16, wherein the processing chamber includes a substantially planar dielectric window and the energy source comprises an antenna adjacent the window, the antenna supplying RF power through the window to energize process gas in the processing chamber into a plasma state.

19. The plasma processing chamber according to claim 16, wherein the silicon carbide member further comprises a gas distribution plate, a focus ring, a perforated baffle between the substrate holder and the liner or combination thereof.

20. The plasma processing chamber according to claim 16, wherein the liner comprises a cylindrical and/or conical liner forming a sidewall of the processing chamber.

21. The plasma processing chamber according to claim 16, wherein the silicon carbide member further comprises a SiC baffle ring.

22. The plasma processing chamber according to claim 17, wherein the silicon carbide member further comprises a SiC baffle ring in contact with the liner and/or the heated member.

23. The plasma processing chamber according to claim 16, wherein the silicon carbide member consists essentially of a composite wherein a coating of SiC forms the exposed surface of the silicon carbide member.

24. The plasma processing chamber according to claim 16, further comprising a SiC gas distribution plate, the gas distribution plate having sufficient resistivity to make the gas distribution plate an insulating material.

25. The plasma processing chamber according to claim 24, wherein the silicon carbide member has a resistivity of at least about $5 \times 10^4$ Ω·cm.

26. The plasma processing chamber according to claim 16, wherein the silicon carbide member comprises CVD SiC.

27. The plasma processing chamber according to claim 24, wherein the processing chamber includes a substantially planar dielectric window and the energy source comprises an antenna adjacent the window, the antenna supplying RF power through the window to energize process gas in the processing chamber into a plasma state.

28. A plasma processing chamber comprising:
- a substrate holder for supporting a substrate within an interior of the processing chamber;
- at least one member having an exposed surface adjacent the substrate, the member comprising a silicon carbide based material having a density of at least 3.1 g/cm$^3$ and including at least 99 wt % carbon and silicon, the member comprising a liner inside the processing chamber and forming a sidewall of the processing chamber wherein the liner is a separate piece attached to an electrically grounded part of the chamber providing electrical grounding of the liner;
- a gas supply supplying process gas to the interior of the processing chamber; and
- an energy source comprising an antenna supplying energy into the interior of the processing chamber, the antenna supplying the energy through a substantially planar dielectric window, and energizing the process gas into a plasma state for processing a substrate, the silicon carbide member minimizing particle contamination of substrates during plasma processing thereof as a result of reduction of plasma potential on the silicon carbide member and/or reduced sputtering of non-silicon carbide chamber interior surfaces.

\* \* \* \* \*